United States Patent
Azuma et al.

(10) Patent No.: US 9,688,228 B2
(45) Date of Patent: Jun. 27, 2017

(54) CONTROL APPARATUS

(71) Applicant: FUJITSU TEN LIMITED, Kobe-shi, Hyogo (JP)

(72) Inventors: Tomoyo Azuma, Kobe (JP); Hiroyuki Wakabayashi, Kobe (JP); Teruo Takenaka, Kobe (JP); Hitoshi Enomoto, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 0 days.

(21) Appl. No.: 14/807,240

(22) Filed: Jul. 23, 2015

(65) Prior Publication Data

US 2016/0031398 A1   Feb. 4, 2016

(30) Foreign Application Priority Data

Jul. 29, 2014   (JP) ................................. 2014-153567

(51) Int. Cl.
*H05K 5/00* (2006.01)
*B60R 21/01* (2006.01)
*H05K 5/02* (2006.01)

(52) U.S. Cl.
CPC .......... *B60R 21/01* (2013.01); *H05K 5/0008* (2013.01); *H05K 5/0017* (2013.01); *H05K 5/0047* (2013.01); *H05K 5/0073* (2013.01); *H05K 5/0078* (2013.01); *H05K 5/0204* (2013.01); *B60R 2021/01006* (2013.01)

(58) Field of Classification Search
None
See application file for complete search history.

(56) References Cited

U.S. PATENT DOCUMENTS

| | | | | |
|---|---|---|---|---|
| 4,850,884 A | * | 7/1989 | Sawai | B60R 16/0239 361/752 |
| 5,144,533 A | * | 9/1992 | Annett | H05K 7/1417 312/223.1 |
| 5,284,359 A | * | 2/1994 | Baba | B60R 21/217 280/728.1 |
| 5,475,566 A | * | 12/1995 | Rada | H05K 5/0013 361/736 |
| 5,577,768 A | * | 11/1996 | Taguchi | B60R 21/2035 280/728.2 |
| 6,094,349 A | * | 7/2000 | Fassel | H05K 3/284 165/80.2 |
| 6,217,377 B1 | * | 4/2001 | Nishizawa | B60R 16/0238 439/553 |

(Continued)

FOREIGN PATENT DOCUMENTS

JP   2002-115653 A   4/2002
JP   2002-308021 A   10/2002

(Continued)

*Primary Examiner* — Courtney Smith
*Assistant Examiner* — Rashen E Morrison
(74) *Attorney, Agent, or Firm* — Oliff PLC

(57) ABSTRACT

To prevent a crack from being transferred to the side surface of a housing by concentrating stress in a notch when an impact is applied to a control apparatus so that the crack develops in the coupling position of the first bracket. This protects the housing and protects the circuit board from a fire hazard, thereby ensuring the control of an air bag during a collision and the reading of an air bag operation record after a collision.

15 Claims, 12 Drawing Sheets

(56) References Cited

U.S. PATENT DOCUMENTS

| | | | | |
|---|---|---|---|---|
| 6,313,400 B1* | 11/2001 | Mosquera | H05K 5/026 | 174/363 |
| 6,628,523 B2* | 9/2003 | Kobayashi | H05K 5/0047 | 361/736 |
| 6,707,678 B2* | 3/2004 | Kobayashi | H05K 5/062 | 361/752 |
| 6,717,051 B2* | 4/2004 | Kobayashi | B60R 16/0239 | 174/535 |
| 6,894,891 B2* | 5/2005 | Darr | H05K 7/142 | 361/601 |
| 7,140,885 B2* | 11/2006 | Kitamura | H05K 5/0039 | 361/752 |
| 7,190,589 B2* | 3/2007 | Caines | H05K 5/061 | 174/16.1 |
| 7,413,463 B2* | 8/2008 | Matsuo | H05K 5/0039 | 439/377 |
| 7,417,868 B2* | 8/2008 | Morisada | H05K 7/1405 | 361/741 |
| 7,563,992 B2* | 7/2009 | Lawlyes | H05K 9/0073 | 174/561 |
| 7,699,622 B2* | 4/2010 | Sakamoto | H01R 13/629 | 439/76.1 |
| 7,813,134 B2* | 10/2010 | Katsuro | H05K 7/20454 | 165/104.33 |
| 8,184,438 B2* | 5/2012 | Kaneko | H05K 7/026 | 165/80.2 |
| 8,408,945 B2* | 4/2013 | Schober | H05K 5/0039 | 439/660 |
| 8,531,845 B2* | 9/2013 | Chen | H05K 5/0208 | 361/752 |
| 8,917,519 B2* | 12/2014 | Sano | H05K 5/0221 | 206/706 |
| 8,933,349 B2* | 1/2015 | Takahashi | H05K 5/0013 | 174/561 |
| 8,942,001 B2* | 1/2015 | Kawai | H05K 5/0052 | 174/50.5 |
| 9,013,889 B2* | 4/2015 | Tamura | H05K 5/0052 | 361/752 |
| 9,093,776 B2* | 7/2015 | Yamanaka | H05K 5/0069 | |
| 9,293,870 B1* | 3/2016 | Koczwara | H01R 12/724 | |
| 9,313,936 B2* | 4/2016 | Seok | H05K 13/0023 | |
| 2002/0149918 A1* | 10/2002 | Koyama | H05K 5/0073 | 361/752 |
| 2004/0212974 A1* | 10/2004 | Ice | G02B 6/4277 | 361/801 |
| 2008/0074840 A1* | 3/2008 | Suzuki | H05K 5/0047 | 361/679.46 |
| 2009/0068862 A1* | 3/2009 | Honda | H05K 5/0052 | 439/78 |
| 2009/0103267 A1* | 4/2009 | Wieland | H05K 7/20409 | 361/707 |
| 2011/0013370 A1* | 1/2011 | Oota | H01L 23/42 | 361/752 |
| 2011/0228498 A1* | 9/2011 | Kawai | H05K 7/20854 | 361/752 |
| 2012/0190252 A1* | 7/2012 | Pavlinsky | H01M 10/425 | 439/775 |
| 2013/0058044 A1* | 3/2013 | Watanabe | H05K 5/006 | 361/714 |
| 2013/0058059 A1* | 3/2013 | Min | H05K 9/0026 | 361/756 |
| 2013/0120943 A1* | 5/2013 | Tamura | H05K 5/0052 | 361/752 |
| 2013/0250521 A1* | 9/2013 | Kawai | H05K 7/20854 | 361/714 |
| 2013/0286606 A1* | 10/2013 | Watanabe | H05K 7/1417 | 361/752 |
| 2014/0065877 A1* | 3/2014 | Ohhashi | H05K 5/0052 | 439/519 |
| 2014/0080329 A1* | 3/2014 | Yamanaka | H05K 5/0069 | 439/76.1 |
| 2014/0085839 A1* | 3/2014 | Nakano | H05K 5/0052 | 361/752 |
| 2014/0334115 A1* | 11/2014 | Yang | H05K 5/06 | 361/752 |
| 2014/0334116 A1* | 11/2014 | Lee | H05K 5/0052 | 361/752 |
| 2014/0362533 A1* | 12/2014 | Shin | H05K 7/2039 | 361/707 |
| 2015/0022976 A1* | 1/2015 | Ott | H01L 23/057 | 361/736 |
| 2015/0146347 A1* | 5/2015 | Lee | H01R 13/5202 | 361/679.01 |
| 2015/0250072 A1* | 9/2015 | Ichikawa | H05K 5/063 | 439/587 |

FOREIGN PATENT DOCUMENTS

| | | |
|---|---|---|
| JP | 2006-205969 A | 8/2006 |
| JP | 2010-241249 A | 10/2010 |
| JP | 2012-001105 A | 1/2012 |
| JP | 2012-190480 A | 10/2012 |
| JP | 2014-192023 A | 10/2014 |

* cited by examiner

CONTROL APPARATUS

BACKGROUND OF THE INVENTION

Field of the Invention

The present invention relates to a technique for a control apparatus that controls the air bag of a vehicle.

Description of the Background Art

In a conventional control apparatus that controls an air bag, the internal circuit board is covered with a metal housing so as to be protected from an impact or the like. By protecting the circuit board, the air bag operates reliably even during occurrence of an impact and the air bag operation record can be read after occurrence of an impact.

Since a bracket projects from the housing in such a control apparatus, a crack is likely to be produced in the bracket during occurrence of an impact. If the crack produced in the bracket reaches the housing, metal debris of the housing may drop on the circuit board, probably causing an ignition due to a short circuit of the circuit or the like. Accordingly, the technique in PTL1 designs the coupling position between the housing and bracket to be disposed in a position lower than the circuit board to prevent metal debris from dropping on the circuit board even if the metal debris is produced in the housing.

However, a crack produced in the bracket may develop above the housing and reach a position higher than the circuit board. In this case, metal debris of the housing may drop on the circuit board and this is a problem in the related art.

SUMMARY OF THE INVENTION

According to an aspect of the present invention, a control apparatus that controls an air bag of a vehicle includes: a case that defines a three-dimensional space and incorporates a circuit board; a first bracket that has one end coupled to a lower edge of a side surface of the case and another end configured to be fixed to the vehicle by a fastening member; and a flange that extends along the lower edge of the side surface, the flange having one end coupled to the first bracket. A notch is provided in a position at which the first bracket is coupled to the flange. This prevents a crack from being transferred to the side surface of the case since the crack develops in the coupling position of the first bracket by concentrating stress in a notch when an impact is applied to in-vehicle equipment.

According to another aspect of the invention, a control apparatus that controls an air bag of a vehicle includes: a case that defines a three-dimensional space and incorporates a circuit board; a bracket that has one end coupled linearly to a lower edge of a side surface of the case and another end configured to be fixed to the vehicle; and a groove formed along a border between the bracket and the side surface. A round shape is formed in a part of the groove adjacent to the side surface. This prevents the case incorporating the circuit board from being broken since a crack develops along the groove when an impact is applied to in-vehicle equipment.

Therefore, an object of the invention is to provide a technique that protects the circuit board in the housing even if an impact is applied to the vehicle.

These and other objects, features, aspects and advantages of the present invention will become more apparent from the following detailed description of the present invention when taken in conjunction with the accompanying drawings.

DESCRIPTION OF THE EMBODIMENTS

Embodiments of the present invention will be described with reference to the drawings.

<1. First Embodiment>

<1-1, Summary>

Figure 1:
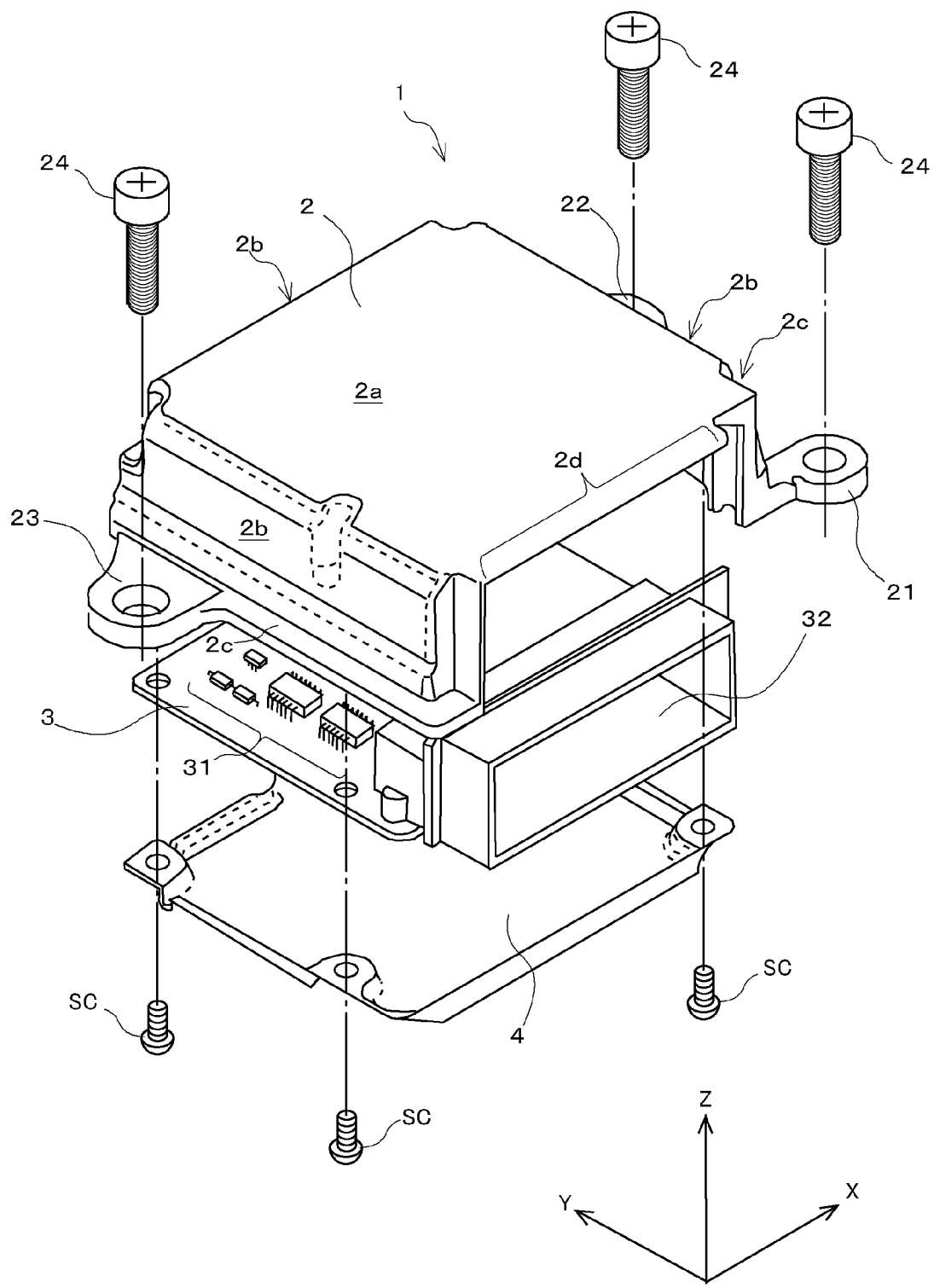
FIG. 1 is an exploded perspective view schematically showing a control apparatus.

FIG. 1 is an exploded perspective view schematically showing a control apparatus 1 that controls the air bag of a vehicle. The control apparatus 1 is an electronic control unit fixed to the inside of the center console of the vehicle. The control apparatus 1 ignites an ignition apparatus of an air bag (not shown) when an impact occurs in the vehicle. The control apparatus 1 includes a housing 2, a circuit board 3, and a back cover 4.

The housing 2 is a metal die-cast case. The housing 2 defines a three-dimensional space and incorporates the circuit board 3 to protect it. The metal material is preferably aluminum. This is because aluminum is lightweight and has good corrosion resistance and good machinability. The housing 2 includes an upper surface 2a, side surfaces 2b, brackets (21, 22, and 23), and flanges 2c, The plane of the housing 2 that has no side surface is a connector opening 2d, The housing 2 functions as a case in the invention.

The circuit board 3 is a plastic planar component. The circuit board 3 incorporates electronic components 31 that control the air bag. The circuit board 3 includes a connector 32 that functions as an input-output for external devices. The connector 32 is disposed in the connector opening 2d of the housing 2 when the circuit board 3 is installed in the housing 2.

The back cover 4 is a metal cover. The back cover 4 protects a back surface of the circuit board 3. The housing 2, the circuit board 3, and the back cover 4 are each have screw holes through which screws SC pass to secure these components.

In the following description, directions and orientations are indicated based on the three-dimensional Cartesian coordinate system shown in FIG. 1. The Cartesian coordinate system is relatively fixed to the control apparatus 1. The X-direction is the right side (side to the right of the connector 32) of the control apparatus 1, Y-direction is the back side (side at the back of the connector 32) of the control apparatus 1, and the Z-direction is the upper side (upper surface side) of the control apparatus 1. Front/rear, right/left, and upper/lower in the following description adhere to the example in FIG. 1.

The first bracket 21 is a mounting member that fixes the control apparatus 1 to the vehicle body. The first bracket 21 is formed at the front (−Y side) right (+X side) corner of the housing 2. One end of the first bracket 21 is coupled to the lower edge of a side surface 2b of the housing 2 and the other end is fixed to the vehicle body by fastening members 24.

The second bracket 22 is a mounting member that fixes the control apparatus 1 to the vehicle body. The second bracket 22 is formed at the back (+Y side) right (+X side) corner of the housing 2.

A third bracket 23 is a mounting member that fixes the control apparatus 1 to the vehicle body. The third bracket 23 is formed symmetrically with the second bracket 22 about the Y axis of the housing 2. Each of the brackets 21, 22, and 23 has a screw hole through which the fastening members 24 such as screws pass to fix the bracket to the vehicle body.

Flanges 2c extend along the lower edges of the right and left side surfaces 2b of the housing 2 so as to project substantially orthogonally. On the right side (+X side) of the housing 2, one end of the flange 2c is formed so as to be coupled to the first bracket 21. On the right side (+X side) of the housing 2, the other end of the flange 2c is formed so as to be coupled to the second bracket 22. On the left side (−X side) of the housing 2, the flange 2c is formed so as to extend from the third bracket 23 to the connector opening 2d.

Figure 2:
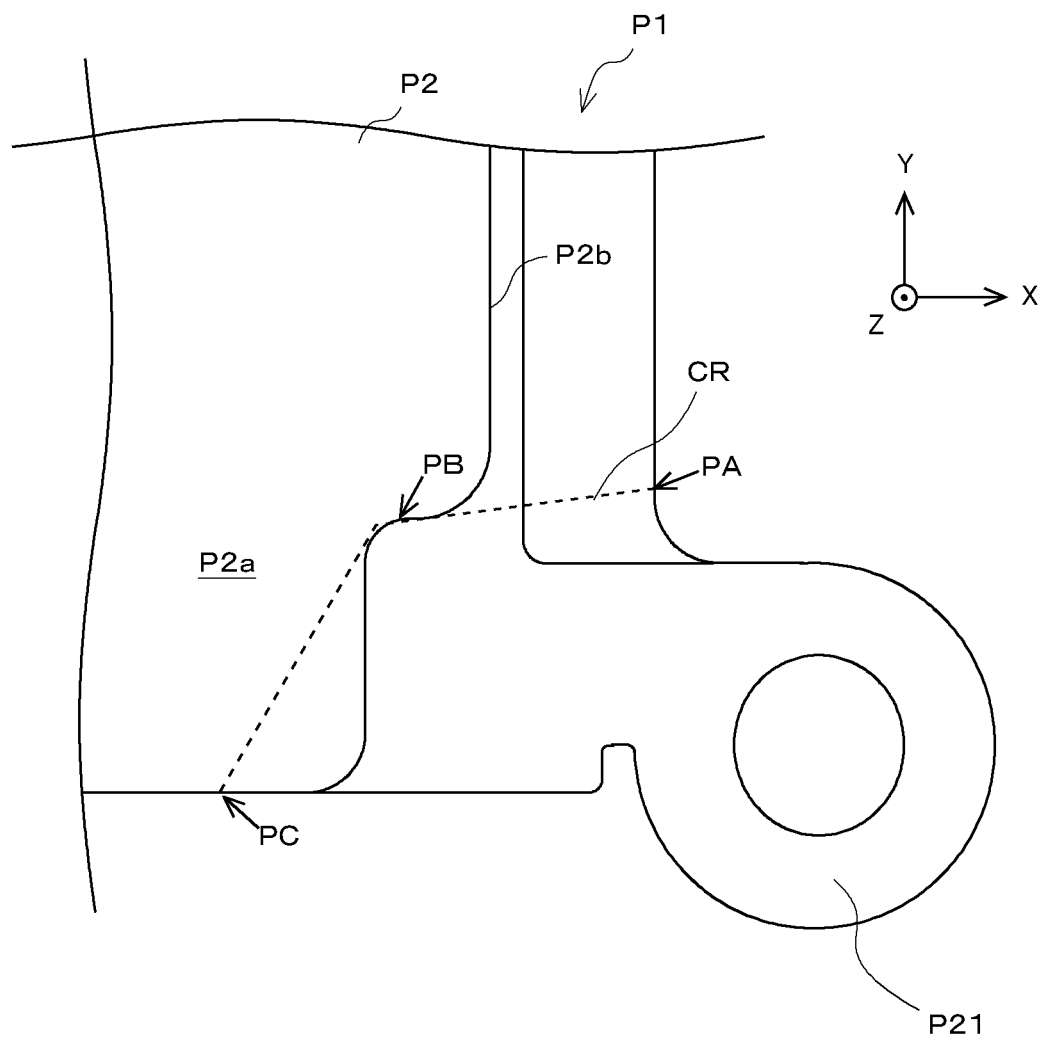
FIG. 2 shows the structure of a conventional bracket.

FIG. 2 is a plan view, seen from the upper side (+Z side), of a first bracket P21 of a housing P2 included in a conventional control apparatus P1.

When an impact is applied to a vehicle due to a collision or the like, the impact is transferred from the vehicle body to the control apparatus P1 via the brackets. If the impact is large, cracks (chaps) are produced in coupling positions between the housing P2 and the brackets.

For example, if a crack CR is produced in the coupling position A between the first bracket P21 and the housing P2, the crack CR reaches a side surface P2b of the housing P2 and may further reach a position C on an upper surface P2a, Since the crack CR reaches the side surface P2b and the upper surface P2a of the housing P2 in this case, debris of the housing P2 produced by the crack CR may drop on a circuit board in the housing P2. If debris of the housing P2 drops on the circuit board, an ignition (a so-called fire hazard) of the circuit board may occur due to occurrence of a short circuit of electronic components or circuits. Occurrence of such a fire hazard not only disables the appropriate control of an air bag, but also disables the reading of an air bag operation record after an accident, causing a problem to be solved. Accordingly, it is necessary to prevent the crack CR produced in the coupling position of the first bracket 21 from being oriented to the side surface P2b, that is, prevent the crack from being oriented from a position PB to a position PC.

Figure 3:
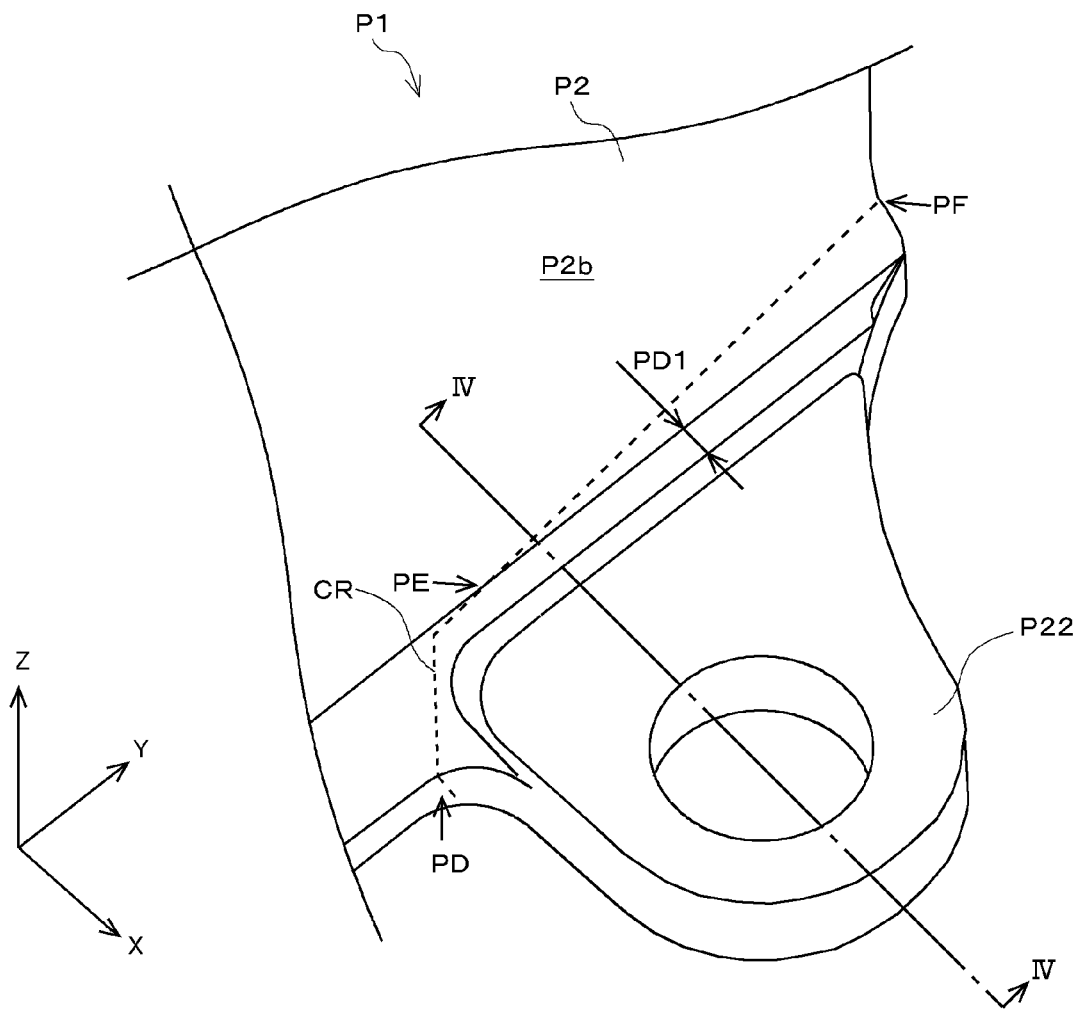
FIG. 3 is a perspective view showing the structure of a conventional bracket.

FIG. 3 is a perspective view, seen from the upper (+Z side) right (+X side), showing the second bracket P22 of the housing P2 included in the conventional control apparatus P1. When an impact is applied to a vehicle due to a collision or the like, the crack CR may be produced not only in the coupling position between the first bracket P21 and the housing P2, but also in the coupling position between the second bracket P22 and the housing P2 or the coupling position between a third bracket P23 and the housing P2.

For example, if the crack CR is produced in a coupling position PD between the second bracket P22 and the housing P2, the crack CR develops from a position PE to the side surface P2b of the housing P2 and may reach a position PF. In this case, as in the above description of the first bracket P21, debris of the housing P2 may drop on the circuit board in the housing P2, possibly causing a fire hazard.

A distance PD1 between the second bracket P22 and the housing P2 is relatively wider than the width of the crack CR. For example, the distance PD1 is 4 mm. One reason for production of the crack CR in the side surface P2b of the housing P2 may be that the distance PD1 between the second bracket P22 and the housing P2 is relatively wider than the width of the crack CR. This is because, when the distance D1 is wide, the crack CR freely develops in a direction in which stress is produced. Accordingly, it is necessary to prevent the crack CR from being oriented to the side surface P2b regardless of the direction of production of stress, that is, to prevent the crack CR from being oriented from the position PE to the position PF.

Figure 4:
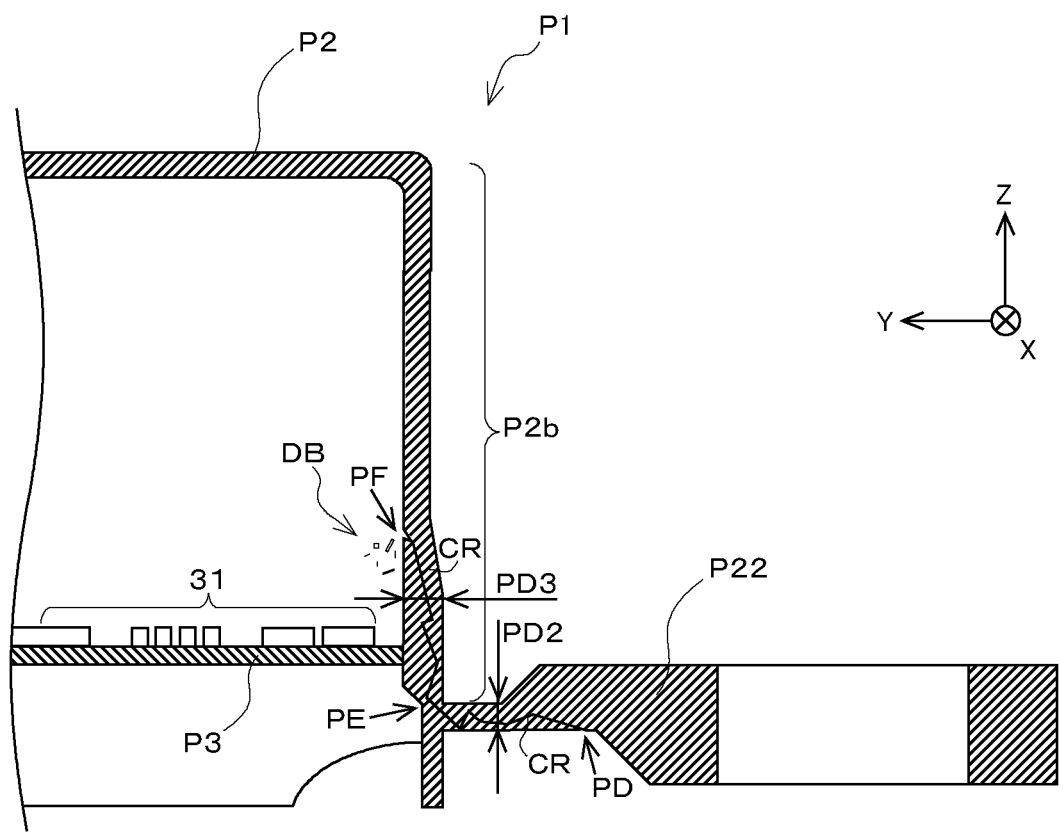
FIG. 4 is a cross sectional view showing the structure of a conventional control apparatus.

FIG. 4 is a cross sectional view, seen from viewpoint IV in FIG. 3, showing the conventional control apparatus P1. For convenience of explanation, the crack CR seen from a viewpoint other than viewpoint IV is also shown together. This is true for other cross sectional views.

As described above, if the crack CR is produced in the coupling position PD between the second bracket P22 and the housing P2, the crack CR develops from the position PE to the side surface P2b and may reach the position PF, which is higher than a circuit board P3 and the electronic components 31. In this case, as in the description of the first bracket P21, debris DB of the housing P2 may drop on the circuit board P3 in the housing P2, possibly causing a fire hazard due to a short circuit or the like of the electronic components 31.

A thickness PD2 of coupling section between the second bracket P22 and the housing P2 is substantially the same as a thickness PD3 of a part of the side surface P2b of the housing P2 near the circuit board P3. For example, the thickness PD2 is 3 mm. Accordingly, the stiffness of the coupling section between the second bracket P22 and the housing P2 is substantially the same as the stiffness of the side surface P2b of the housing P2.

One reason for production of the crack CR in the side surface P2b of the housing P2 is that the thickness PD2 of the coupling section between the second bracket P22 and the housing P2 is substantially the same as the thickness of the side surface P2b of the housing P2 (that is, both have the same stiffness). This is because, when both have substantially the same stiffness, the crack CR freely develops in the direction in which stress is produced.

Accordingly, it is necessary to prevent the crack CR from being oriented to the side surface P2b regardless of the direction of production of stress, that is, to prevent the crack CR from being oriented from the position PE to the position PF, which is higher than the circuit board P3 and the electronic components 31.

<1-2, Structure>

Figure 5:
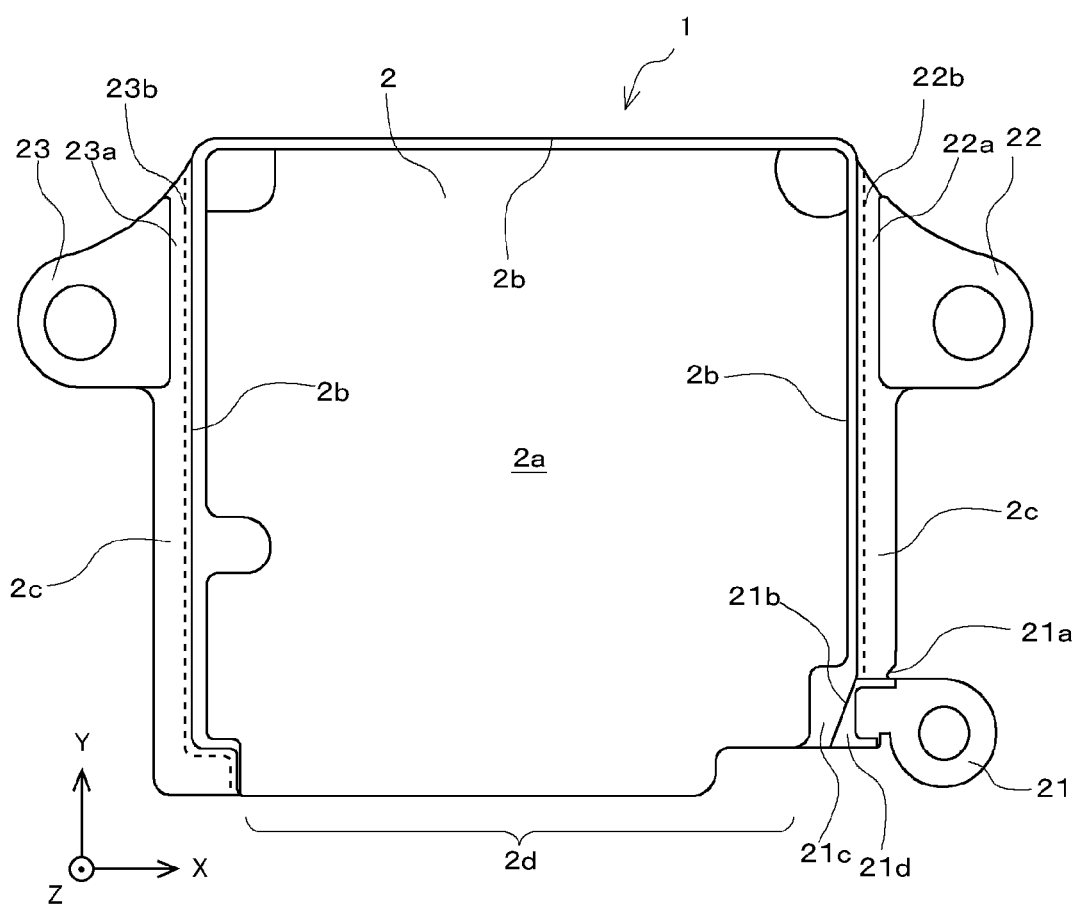
FIG. 5 shows the structure of a control apparatus according to the present embodiment.

FIG. 5 is a diagram, seen from the above (+Z side), showing the control apparatus 1 according to the embodiment of the invention. The upper surface of the control apparatus 1 is covered with the housing 2. The housing 2 mainly includes the upper surface 2a, the three side surfaces 2b, the two flanges 2c formed on the right and left side surfaces, the first bracket 21, the second bracket 22, and the third bracket 23. The plane of the housing 2 that has no side surface 2b is a connector opening 2d.

The first bracket 21 projects rightward (+X side) at the front (−Y side) right (+X side) corner of the housing 2, seen from the above, and is coupled to one end of the flange 2c, A notch 21a is formed in the coupling position between the first bracket 21 and the flange 2c, An inclined surface 21b is formed in the coupling position between the first bracket 21 and the side surface 2b, The inclined surface 21b is a plane inclined inward (−X side) with respect to the main plane of the side surface 2b. An inclined section 21c is formed on the connector opening side (−Y side) of the side surface 2b provided with the first bracket 21. A reinforcing section 21d is formed in the coupling position between the first bracket 21 and the side surface 2b, The thickness of the reinforcing section 21d increases gradually from the first bracket 21 to the side surface 2b, Details on components near the first bracket 21 will be described later.

The second bracket 22 has one end coupled linearly to the lower edge of the side surface 2b of the housing 2 and another projecting end. The flange 2c is formed to couple the first bracket 21 to the second bracket 22. A groove 22a is formed along the border between the second bracket 22 and the side surface 2b and the border between the flange 2c and the side surface 2b, A round shape 22b is formed in a part of the groove 22a adjacent to the side surface 2b, The round shape is a so-called R-chamfered shape.

The third bracket 23, the flange 2c, the groove 22a, and the round shape 22b on the right side (+X side) of the housing 2 are also formed on the left side (−Y side) of the housing 2 similarly. That is, these are formed line-symmetrically about the Y-axis of the housing 2.

Figure 6:
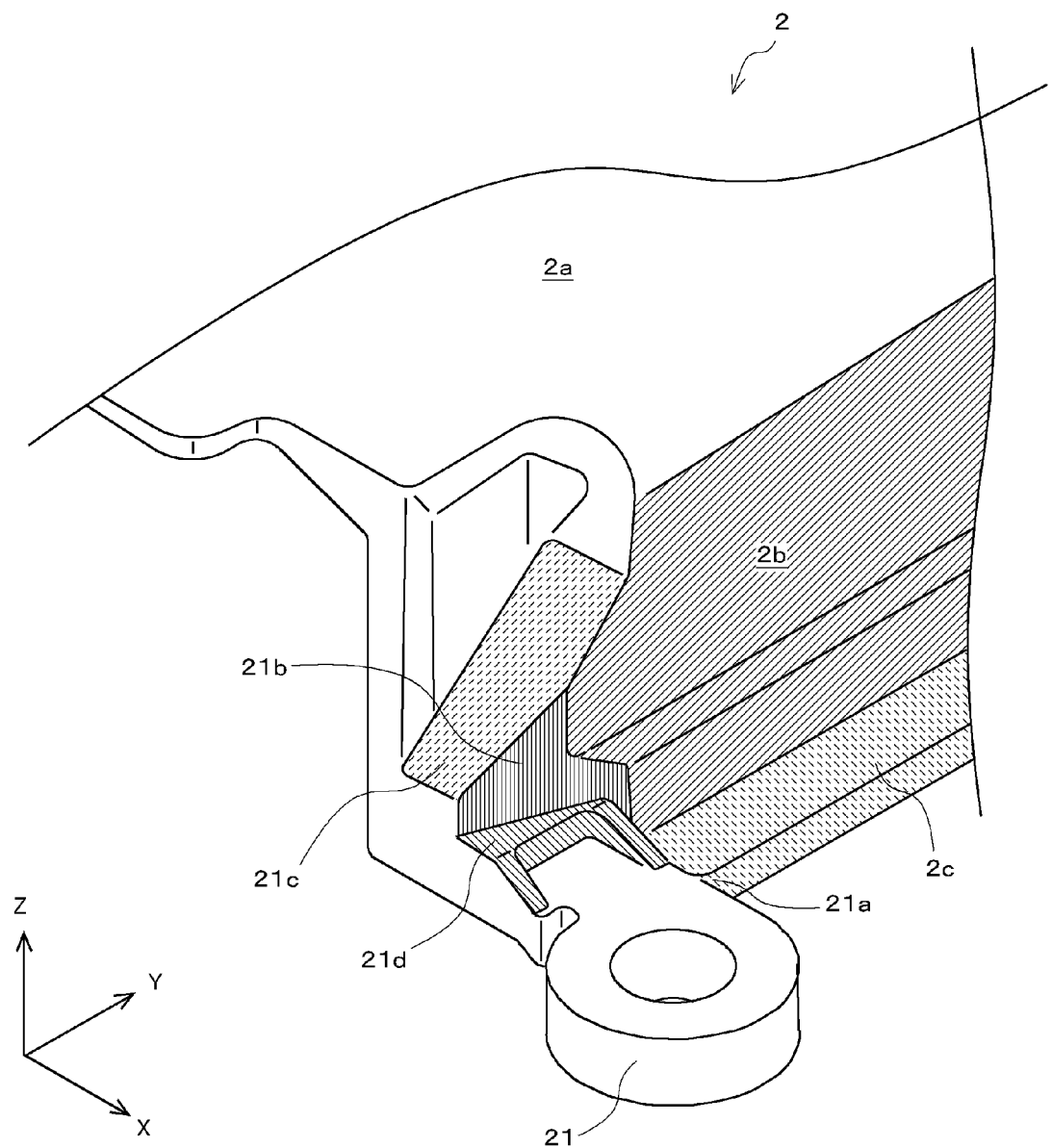
FIG. 6 is a perspective view showing the structure of the control apparatus according to the embodiment.

FIG. 6 is a diagram, seen from the oblique above (the +X and −Y side in the viewpoint in FIG. 5), showing the vicinity of the first bracket 21 of the housing 2. The housing 2 included in the control apparatus 1 includes the notch 21a, the inclined surface 21b, the inclined section 21c, and the reinforcing section 21d near the first bracket 21. In addition, the housing 2 includes the flange 2c along the lower edge of the side surface 2b, These components included in the housing 2 are formed to correct the direction of development of a crack. That is, these components guide a produced crack away from the side surface 2b to prevent the crack from developing toward the side surface 2b of the housing 2.

The notch 21a is formed like substantially an S-shape in the coupling position between the first bracket 21 and the flange 2c, During occurrence of an impact, stress is concentrated in the notch 21a and a crack is produced in the notch 21a.

The inclined surface 21b is a planar inclined inward, that is, on the connector side (−X side), with respect to the side surface 2b in the coupling position between the side surface 2b and the first bracket 22. Accordingly, the inclined surface 21b is a part of the side surface 2b that has one end coupled to the side surface 2b, The inclined surface 21b functions as a route guiding the direction of development of a crack produced in the notch 21a.

The inclined section 21c is formed so as to connect portions having different thicknesses in the housing 2 to each other in an inclined manner. The side surface 2b of the housing 2 has portions having different thicknesses. The thickness of the side surface 2b will be described later. Since the housing 2 is a metal die-cast component, if there are portions having different thicknesses in the die, the material retains in the die, possibly causing a production failure. The inclined section 21c connects portions having different thicknesses in the housing 2 and to each other in an inclined manner to promote a smooth flow of the material in the die and prevent retention.

The reinforcing section 21d is formed so as to have a thickness gradually increasing from the first bracket 21 to the side surface 2b in coupling position between the first bracket 21 and the side surface 2b, That is, the reinforcing section 21d has a so-called slope shape with a height increasing from the first bracket 21 to the side surface 2b, Since there is the reinforcing section 21d having a thickness gradually increasing, the stiffness of the housing 2 is higher than that of the first bracket 21. When the stiffness of the housing 2 is higher than that of the first bracket 21, if an impact is applied to the control apparatus 1, a crack is produced in the first bracket 21 and the development of the crack toward the housing 2 can be prevented. That is, during occurrence of an impact, only the first bracket 21 is broken while the housing 2 is prevented from being broken.

The flange 2c extends along the lower edge of the side surface 2b and has one end coupled to the first bracket 21. Since the flange 2c is formed along the lower edge of the side surface 2b, deformation (generation of stress on the side surface 2b) of the side surface 2b is suppressed and production of a crack in the side surface 2b is prevented. The flange 2c formed close to the third bracket 23 side (−X side) has similar effects.

Figure 7:
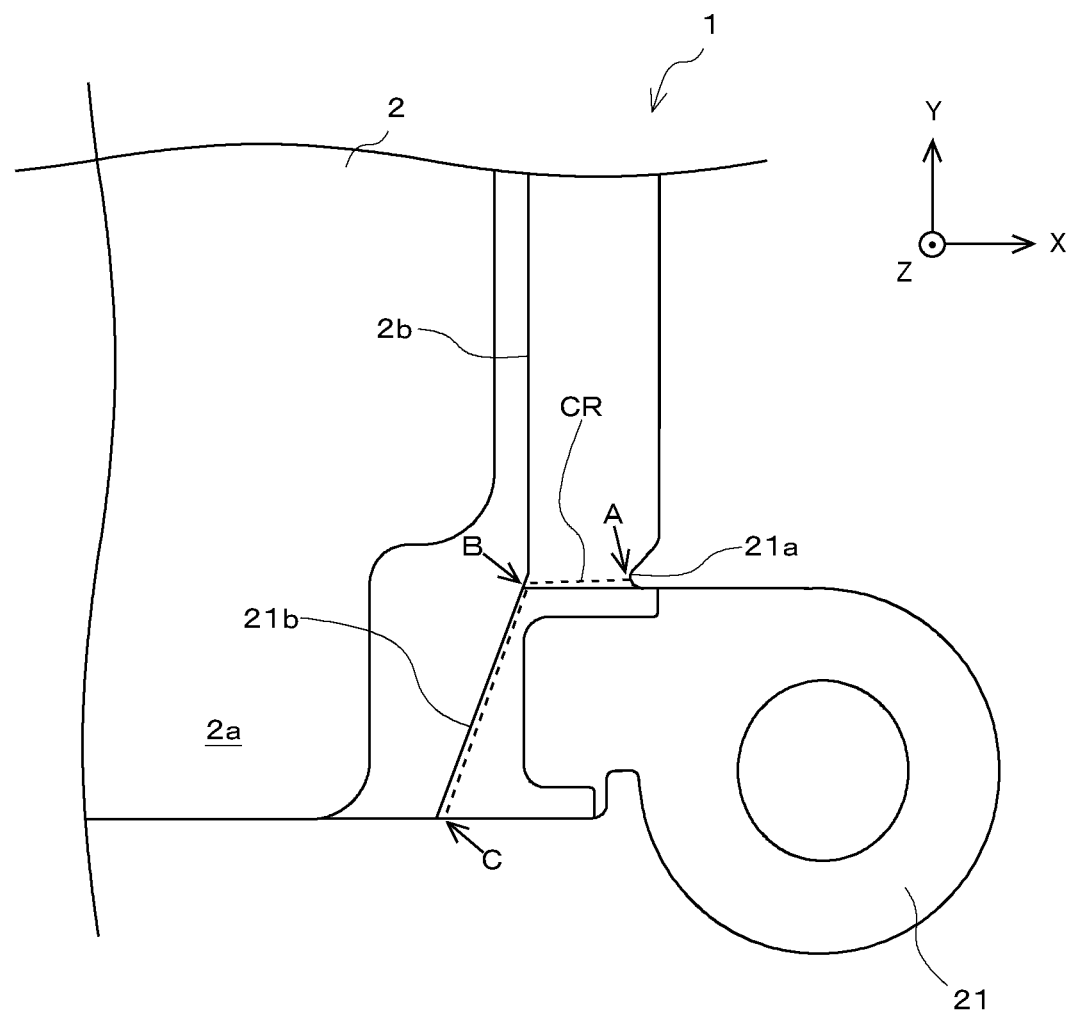
FIG. 7 shows the structure of a bracket according to the embodiment.

FIG. 7 is a diagram, seen from the above (+Z side), showing the first bracket 21 included in the control apparatus 1. The notch 21a is formed so as to be gently curved from the outer side (+X side) end of the flange 2c to the inner side (−X side), draw substantially a semicircle toward the outer side (+X side) in a position close to the first bracket 21, and reach the first bracket 21. That is, the notch 21a is formed like substantially an S-shape with a gentle curve at one corner. The notch 21a is formed so that the stress of an impact is concentrated in a position in the substantially semicircle.

If the stress of an impact is concentrated in a position A in the substantially semicircle of the notch 21a and the crack CR is produced, the crack CR develops in the coupling position between the first bracket 21 and the flange 2c and reaches a position B in the inclined surface 21b. The crack CR that has reached the position B develops according to guidance by the inclined surface 21b and reaches a coupling position C close to the connector opening 2d of the first bracket 21. As described above, it is possible to produce the crack CR in the notch 21a, guide the direction of development by the inclined surface 21b, and guide the crack CR away from the housing 2 so that the crack CR does not reach the side surface 2b. Accordingly, the crack CR is produced only in positions away from the circuit board to be protected, thereby preventing occurrence of a fire hazard. As such, the notch 21a is part of an impact reduction mechanism.

Figure 8:
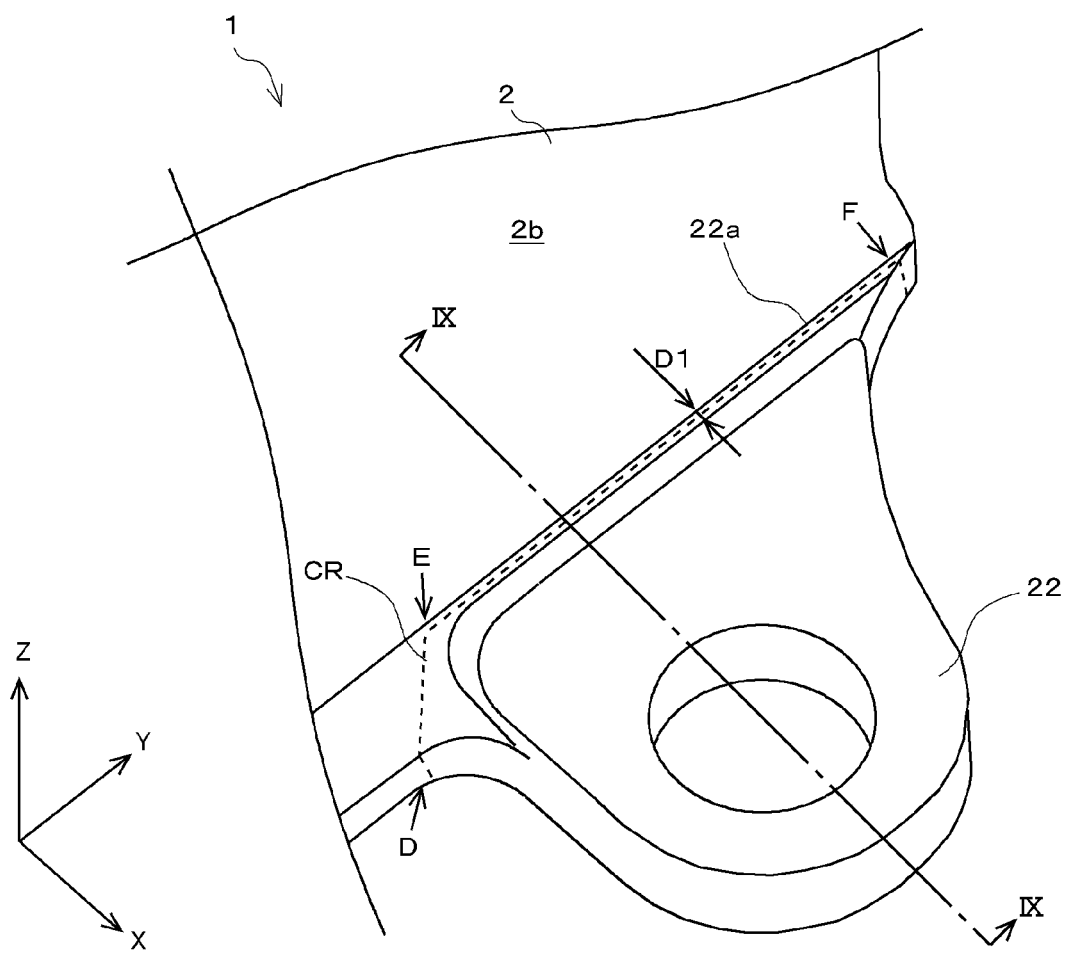
FIG. 8 is a perspective view showing the structure of a bracket according to the embodiment.

FIG. 8 is a perspective view, seen from the upper (+Z side) right (+X side), showing the second bracket 22 of the housing 2 included in the control apparatus 1. When an impact is applied to a vehicle due to a collision or the like, the crack CR is produced in a coupling position D between the second bracket 22 and the housing 2. The crack CR produced in the coupling position D develops to a position E near the side surface 2b of the housing 2 and reaches the groove 22a. After that, the crack CR develops along the groove 22a and reaches a position F. Since the crack CR develops in the groove 22a in this period, the crack CR is not produced in the side surface 2b of the housing 2. In addition, a round shape is formed in a part of the groove 22a adjacent to the side surface 2b. This round shape promotes the development of the crack CR within the groove 22a. Accordingly, the crack CR does not develop to the housing 2, thereby preventing occurrence of a fire hazard due to a drop of debris of the housing 2 onto the circuit board in the housing 2. As such, the groove 22a is part of the impact reduction mechanism.

A distance D1 between the second bracket 22 and the housing 2 is formed so as to be close to the width of the crack CR. For example, the distance D1 is 1 mm to 2 mm. Development of the crack CR to the side surface 2b of the housing 2 can be prevented by making the distance D1 between the second bracket 22 and the housing 2 close to the width of the crack CR instead of making the distance D1 relatively larger than the width of the crack CR. This is because, when the distance D1 is larger, the crack CR freely develops in the direction in which stress is produced. Accordingly, it is necessary to prevent the crack CR from being oriented to the side surface 2b regardless of the direction of production of stress, that is, to make the crack CR be oriented from the position E to the position F.

Figure 9:
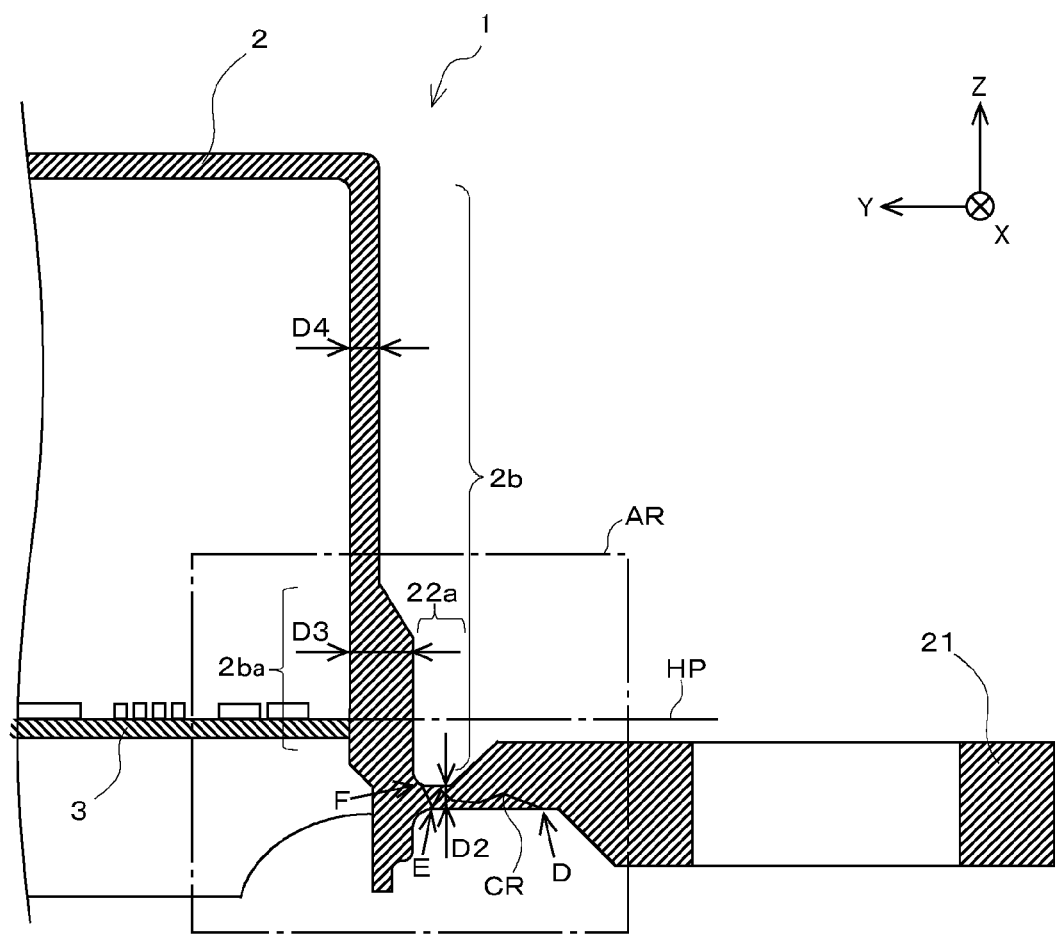
FIG. 9 is a cross sectional view showing the structure of the control apparatus according to the embodiment.

FIG. 9 is a cross sectional view, seen from the viewpoint IX in FIG. 8, showing the control apparatus 1. The thickness D3 of a vicinity 2ba of the side surface 2b of the housing 2 near the circuit board 3 is formed so as to become larger than the thickness D2 of the coupling section between the second bracket 22 and the housing 2. The vicinity 2ba is a part of the side surface 2b extending above and below (+Z side and −Z side) the circuit board 3. That is, the thickness of a part of the side surface 2ba adjacent to a position of the groove 22a is larger than the thickness of the groove 22a. For example, the thickness D3 of the vicinity 2ba of the side surface 2b of the housing 2 near the circuit board 3 is 5 mm. The thickness D2 of the coupling section between the second bracket 22 and the housing 2 is 3 mm. The thickness D4 of a part of the side surface 2b of the housing 2 higher than the circuit board 3 is 3 mm.

By making these thicknesses different from each other as described above, the stiffness of the coupling section between the second bracket 22 and the housing 2 becomes different from the stiffness of the vicinity 2ba of the side surface 2b of the housing 2 near the circuit board 3. That is, the stiffness of the vicinity 2ba of the side surface 2b of the housing 2 near the circuit board 3 can become higher than the stiffness of the coupling section between the second bracket 22 and the housing 2. Even if the crack CR produced in the position D in the second bracket 22 reaches the position E in the coupling section, the crack CR does not reach the vicinity 2ba of the side surface 2b of the housing 2 near the circuit board 3 and develops in the position F in the groove formed in the coupling section. Even if the crack CR reaches a position below the vicinity 2ba, it is possible to prevent the crack CR from reaching a position above (Z side) the circuit board 3.

Accordingly, it is possible to prevent the crack CR from being oriented to the side surface 2b regardless of the direction of production of stress, that is, to prevent the crack CR from being oriented from the position F to a position that is higher than the circuit board 3 and the electronic components 31.

Figure 10:
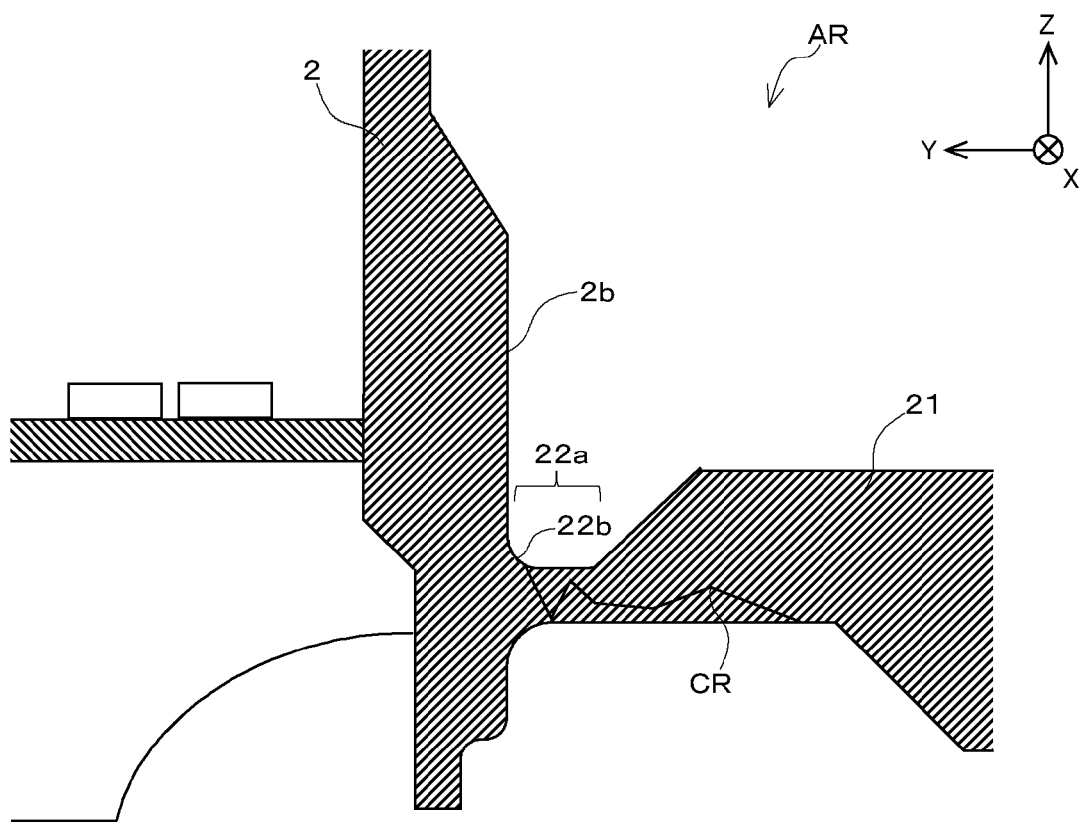
FIG. 10 is an enlarge view of a cross section showing the structure of the control apparatus.

FIG. 10 is an enlarge view showing an area AR in FIG. 9. As described above, the concave groove 22a is formed along the border between the second bracket 22 and the side surface 2b, The width of the groove 22a is, for example, 2 mm. The R-chamfered round shape 22b is formed in a part of the groove 22a adjacent to the side surface 2b, Accordingly, the groove 22a prevents the crack CR from reaching the side surface 2b because the crack CR develops in the groove 22a, In addition, the groove 22a enables a breakage by the crack CR to be produced in a part lower (−Z side) than the circuit board 3.

Casting failures such as casting cavities are suppressed by forming the round shape 22b in the connection portion between the side surface 2b and the second bracket 22. By forming the round shape 22b, the material smoothly flows into the bracket during casting and the strength of the second bracket 22 is improved. In addition, if stress is concentrated in the round shape 22b during occurrence of an impact, a breakage occurs only in the connection portion between the side surface 2b and the second bracket 22. Accordingly, the round shape 22b achieves both the improvement of strength and the concentration of stress. The round shape 22b preferably has the smallest R-shape that can ensure castability. The round shape 22b is, for example, R1. This is because, when the R-shape becomes large, stress is distributed in the round shape 22b and the crack CR is likely to develop to the side surface 2b.

As described above, the control apparatus 1 that controls the air bag of a vehicle according to the embodiment of the invention includes the housing 2 that incorporates the circuit board 3, the first bracket 21 that has one end coupled to the lower edge of the side surface 2b of the housing 2 and the other end fixed to a vehicle by fastening members, and the flange 2c that extends along the lower edge of the side surface 2b of the housing 2 and has one end coupled to the first bracket 21, in which the notch 21a is provided in a position at which the first bracket 21 is coupled to the flange 2c.

In such a structure, when an impact is applied to the control apparatus 1, stress is concentrated in the notch 21a so that the crack CR develops in the coupling position of the first bracket 21 to prevent the crack CR from reaching the side surface 2b of the housing 2. That is, the direction of development of the crack CR can be controlled. Particularly, it is important to prevent the crack CR produced in the first bracket 21 from reaching the housing 2 and the debris DB from dropping on the circuit board 3 in the housing 2. This protects the housing 2 and protects the circuit board 3 from a fire hazard, thereby ensuring the control of the air bag during a collision and the reading of an air bag operation record after a collision.

<2. Modifications>

Embodiments of the invention have been described above. However, the invention is not limited to the above embodiments. The invention may be modified. Modifications will be described below. The above embodiments and the following embodiments may be combined as appropriate.

Figure 11:
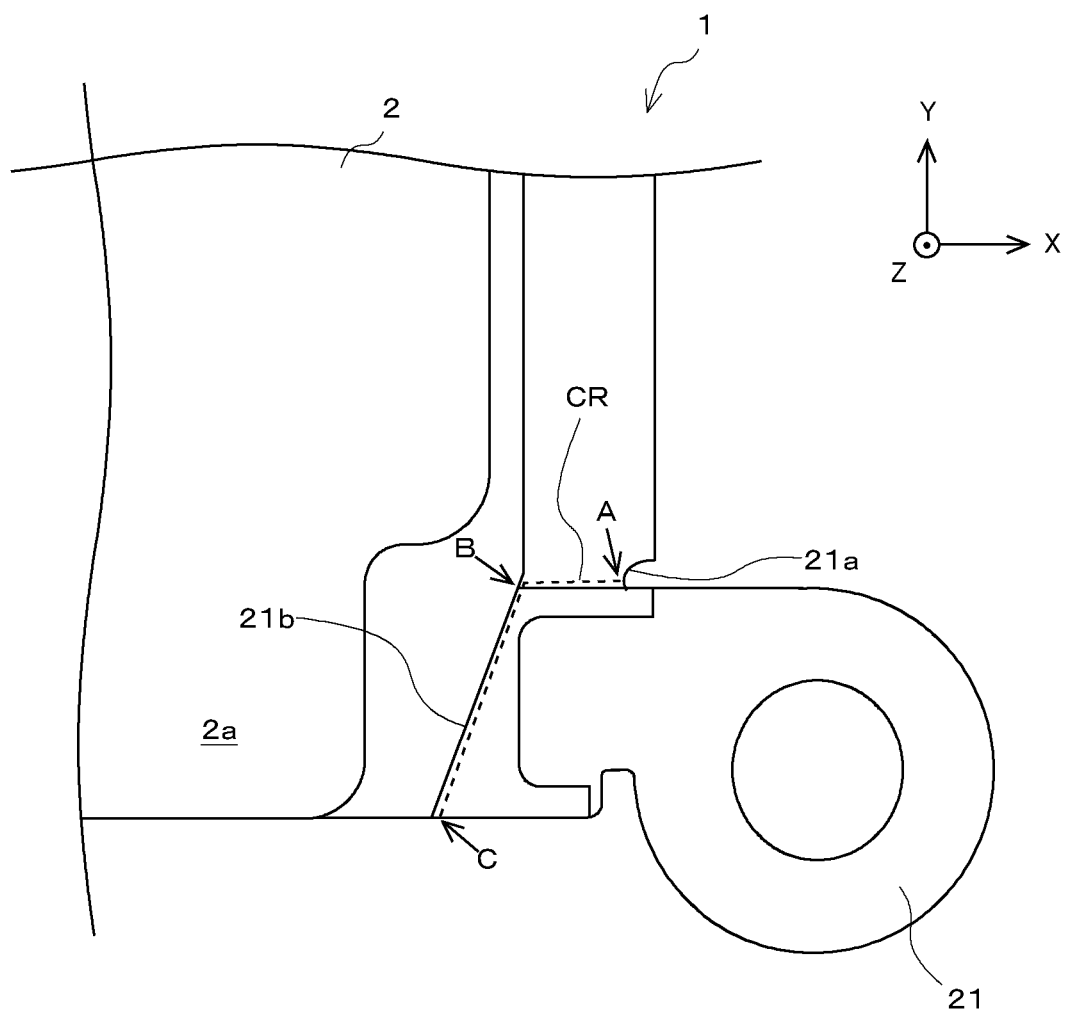
FIG. 11 shows a modification of the embodiment.
Figure 12:
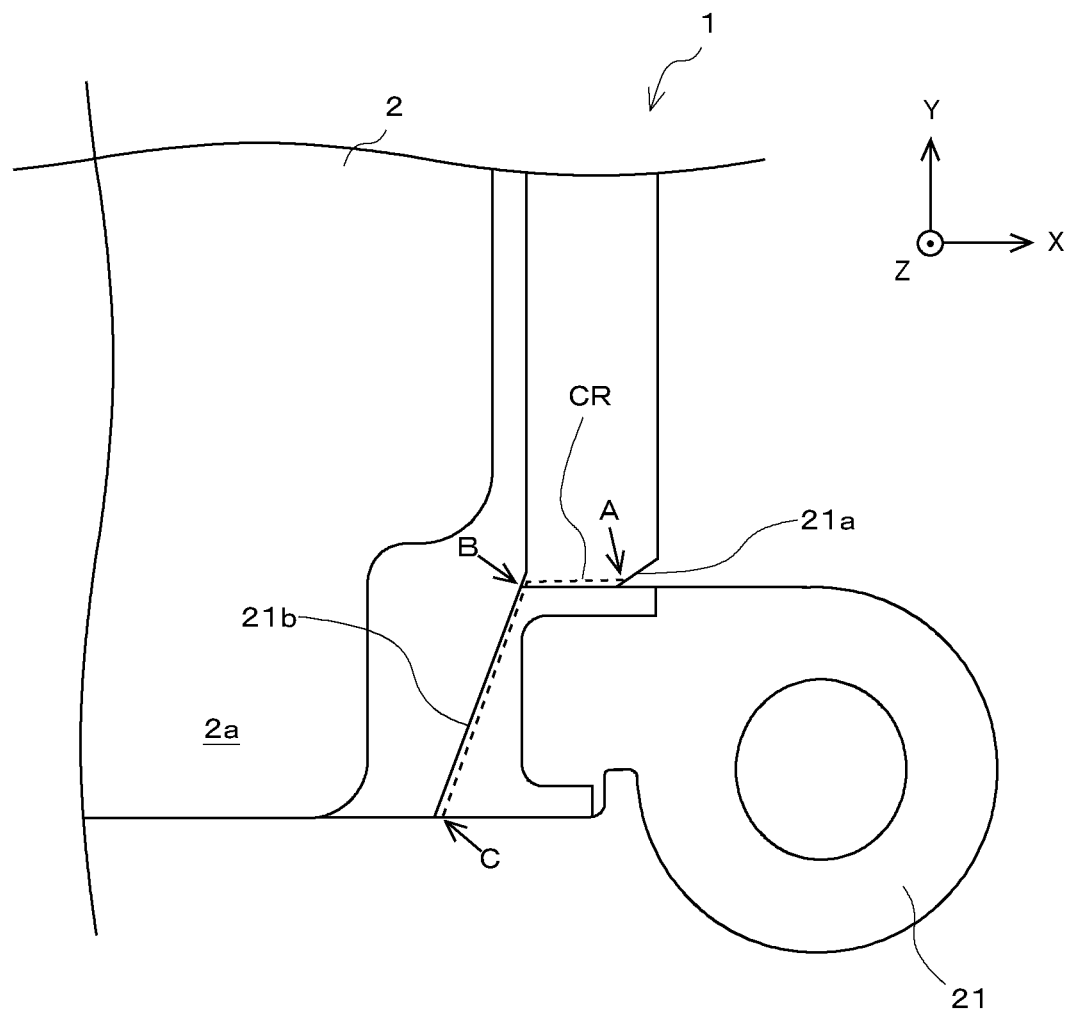
FIG. 12 shows another modification of the embodiment.

In the above embodiment, the notch 21a has substantially an S-shape with a gentle curve at one corner. However, the notch 21a may have another shape. The notch 21a only needs to have a shape in which the stress of an impact is concentrated. FIG. 11 shows another shape of the notch 21a, As illustrated, the notch 21a may have a shape obtained by substantially quartering a circle (or ellipse). The stress of an impact is concentrated in the notch 21a even when the notch 21 has such a shape. Accordingly, it is possible to prevent the crack CR from developing from the position A in FIG. 11 to the position B and the position C and reaching the side surface 2b of the housing 2. In addition, the notch 21a may have a notched shape with a sharp angle as shown in FIG. 12 in addition to substantially an S-shape or a shape obtained by substantially quartering a circle.

In the above embodiment, the housing 2 is preferably made of aluminum. However, the housing 2 may be made of another conductive material. This is because a fire hazard may occur even in the case of another material. The invention also has the above technical effects on a housing made of another conductive material.

While the invention has been shown and described in detail, the foregoing description is in all aspects illustrative and not restrictive. It is therefore understood that numerous other modifications and variations can be devised without departing from the scope of the invention.

What is claimed is:

1. A control apparatus that controls an air bag of a vehicle, the control apparatus comprising:
    a case that defines a three-dimensional space and incorporates a circuit board;
    a first bracket that has one end coupled to a lower edge of a side surface of the case and another end configured to be fixed to the vehicle by a fastening member;
    a flange that extends along the lower edge of the side surface, the flange having one end coupled to the first bracket, and
    an impact reduction mechanism that protects the circuit board when the control apparatus is under an impact, the impact reduction mechanism including a notch,
    wherein the notch is provided in a position at which the first bracket is coupled to the flange, the notch is formed in a portion of the flange, the flange extends horizontally and from the side surface and has an outer edge at a distance from the side surface and a width between the side surface and the outer edge, and the width is smaller at the notch than at remaining portions of the flange, and
    the notch breaks under the impact due to the smaller width of the flange at the notch to reduce effect of the impact on the circuit board.

2. The control apparatus according to claim 1,
    wherein the side surface has an inclined surface inclined inward with respect to a main surface of the side surface, the inclined surface located in a position at which the first bracket is coupled to the side surface.

3. The control apparatus according to claim 1,
    wherein a thickness of the side surface adjacent to a position at which the first bracket is coupled to the side surface is larger than a thickness of the first bracket.

4. The control apparatus according to claim 1, further comprising:
    a reinforcing section having a thickness increasing gradually from the first bracket to the side surface, the reinforcing section being disposed in a position at which the first bracket is coupled to the side surface.

5. The control apparatus according to claim 1,
    wherein the case has an inclined section that connects portions of the case having different thicknesses to each other in an inclined manner.

6. The control apparatus according to claim 2, further comprising:
    a reinforcing section having a thickness increasing gradually from the first bracket to the side surface, the reinforcing section being disposed in a position at which the first bracket is couple to the side surface.

7. The control apparatus according to claim 2,
    wherein the case has an inclined section that connects portions of the case having different thickness to each other in an inclined manner.

8. The control apparatus according to claim 4,
    wherein the case has an inclined section that connects portions of the case having different thicknesses to each other in an inclined manner.

9. The control apparatus according to claim 6,
    wherein the case has an inclined section that connects portions of the case having different thicknesses to each other in an inclined manner.

10. The control apparatus according to claim 1, further comprising:
    a second bracket that has one end coupled linearly to the lower edge of the side surface of the case and another end configured to be fixed to the vehicle by a fastening member; and
    a groove formed along a border between the second bracket and the side surface,
    wherein a round shape is formed in a part of the groove adjacent to the side surface.

11. The control apparatus according to claim 10,
    wherein a thickness of the side surface adjacent to a position of the groove is larger than a thickness of the groove.

12. A control apparatus that controls an air bag of a vehicle, the control apparatus comprising:
    a case that defines a three-dimensional space and incorporates a circuit board;
    a bracket that has one end coupled linearly to a lower edge of a side surface of the case and another end configured to be fixed to the vehicle; and
    an impact reduction mechanism that protects the circuit board when the control apparatus is under an impact, the impact reduction mechanism including a groove,
    wherein the groove is formed along a border between the bracket and the side surface,
    a round shape is formed in a part of the groove adjacent to the side surface, the groove is formed in a portion of the bracket, and a thickness of the bracket is smaller at the groove than at remaining portions of the bracket, and
    the groove breaks under the impact due to the smaller thickness of the bracket to reduce effect of the impact on the circuit board.

13. The control apparatus according to claim 12,
    wherein a thickness of the side surface adjacent to a position of the groove is larger than a thickness of the groove.

14. The control apparatus according to claim 1, the impact reduction mechanism further including a groove,
    wherein the groove is formed along a border between the bracket and the side surface,
    a round shape is formed in a part of the groove adjacent to the side surface, the groove is formed in a portion of the bracket, and a thickness of the bracket is smaller at the groove than at remaining portions of the bracket, and
    the groove breaks under the impact due to the smaller thickness of the bracket to reduce effect of the impact on the circuit board.

15. The control apparatus according to claim 12, the impact reduction mechanism further including a notch,
    wherein the notch is provided in a position at which the first bracket is coupled to the flange, the notch is formed in a portion of the flange, the flange extends horizontally and from the side surface and has an outer edge at a distance from the side surface and a width between the side surface and the outer edge, and the width is smaller at the notch than at remaining portions of the flange, and
    the notch breaks under the impact due to the smaller width of the flange at the notch to reduce effect of the impact on the circuit board.

* * * * *